United States Patent
Kretz et al.

(10) Patent No.: US 8,508,457 B2
(45) Date of Patent: Aug. 13, 2013

(54) SHIFT REGISTER FOR AN ACTIVE-MATRIX FLAT SCREEN

(75) Inventors: Thierry Kretz, Saint Jean de Moirans (FR); Gérard Voisin, Saint Medard en Jalles (FR)

(73) Assignee: Thales, Neuilly-Sur-Seine (FR)

( * ) Notice: Subject to any disclaimer, the term of this patent is extended or adjusted under 35 U.S.C. 154(b) by 700 days.

(21) Appl. No.: 12/676,898

(22) PCT Filed: Sep. 8, 2008

(86) PCT No.: PCT/EP2008/061866
§ 371 (c)(1),
(2), (4) Date: Jul. 13, 2010

(87) PCT Pub. No.: WO2009/030776
PCT Pub. Date: Mar. 12, 2009

(65) Prior Publication Data
US 2010/0283715 A1    Nov. 11, 2010

(30) Foreign Application Priority Data
Sep. 7, 2007   (FR) .................................. 07 06281

(51) Int. Cl.
*G09G 3/36* (2006.01)

(52) U.S. Cl.
USPC ................. 345/100; 345/94; 345/96; 345/99; 345/102; 345/104

(58) Field of Classification Search
USPC ............... 345/94–100, 204–212; 377/74–79, 377/115, 129; 257/84, 184, 187; 349/149–153
See application file for complete search history.

(56) References Cited

U.S. PATENT DOCUMENTS

| | | | | |
|---|---|---|---|---|
| 5,654,970 A * | 8/1997 | DaCosta et al. | ............... | 714/726 |
| 6,064,713 A * | 5/2000 | Lebrun et al. | .................... | 377/67 |
| 7,145,545 B2 * | 12/2006 | Zebedee et al. | ............... | 345/100 |
| 7,688,933 B2 * | 3/2010 | Morosawa | ........................ | 377/64 |
| 7,714,589 B2 * | 5/2010 | Jun et al. | ........................ | 324/527 |
| 7,733,320 B2 * | 6/2010 | Yamaguchi et al. | .......... | 345/100 |
| 2001/0030722 A1 * | 10/2001 | Murade | ........................ | 349/110 |
| 2003/0076149 A1 * | 4/2003 | Haga | ............................ | 327/333 |
| 2004/0150610 A1 * | 8/2004 | Zebedee et al. | ............... | 345/100 |
| 2006/0210012 A1 * | 9/2006 | Yamaguchi et al. | ............ | 377/64 |
| 2007/0171179 A1 * | 7/2007 | Morosawa | .................... | 345/100 |
| 2008/0231556 A1 | 9/2008 | Kretz et al. | | |
| 2009/0096725 A1 | 4/2009 | Kretz et al. | | |

FOREIGN PATENT DOCUMENTS

| | | |
|---|---|---|
| WO | 97/25716 A1 | 7/1997 |
| WO | 98/53366 A1 | 11/1998 |
| WO | 2006/013542 A2 | 2/2006 |
| WO | 2007/020215 A1 | 2/2007 |

* cited by examiner

*Primary Examiner* — Prabodh M Dharia
(74) *Attorney, Agent, or Firm* — Baker & Hostetler LLP

(57) ABSTRACT

A shift register driven by two complementary clock signals is integrated on an active-matrix substrate of a flat screen for controlling selection of rows of image points of the flat screen is disclosed. The shift register includes a control transistor driven by one of the clock signals, and connected between this clock signal and an output node connected to a corresponding row. The shift register also includes a capacitor connected between an internal node connected to the gate of the control transistor. The output node is discharged each time the flat screen starts.

10 Claims, 8 Drawing Sheets

… … …

SHIFT REGISTER FOR AN ACTIVE-MATRIX FLAT SCREEN

CROSS-REFERENCE TO RELATED APPLICATIONS

This application is a National Stage of International patent application PCT/EP2008/061866, filed on Sep. 8, 2008, which claims priority to foreign French patent application No. FR 07 06281, filed on Sep. 7, 2007, the disclosures of which are hereby incorporated by reference in their entirety.

FIELD OF THE INVENTION

The present invention relates to a refinement of the control circuits for the selection rows of an active matrix of a flat screen, and more particularly a refinement of control circuits that are integrated into the active matrix. It applies to the various technologies of active-matrix flat screens, notably to liquid crystal and OLED (Organic light-emitting diode) technologies.

BACKGROUND OF THE INVENTION

In an active matrix with integrated peripheral control circuits, the pixel electrodes and the associated switching transistors for the image points, as well as the control circuits for the rows and columns of pixel electrodes, are made at the same time on the same substrate.

The row control circuits, commonly called "row drivers" in the technical literature, make it possible, with each new video frame to be displayed, to apply the row selection signals one after the other along a direction of scan of the rows of the screen.

These control circuits comprise for this purpose one or more shift registers in series, each output stage of the registers delivering the selection signal for a given matrix row.

Patent application EP 0815 562 discloses an advantageously simple structure with so-called "bootstrap" autoboost capacitors and transistors for making the stages of a shift register, which makes it possible to profit from a beneficial voltage boost effect, so as to provide the high voltage level expected on the rows of the matrix, while limiting the stress on the transistors of the stage. It makes it possible to use the same technology of transistors for the register and for the active matrix, notably thin-film transistors having thin layers of hydrogenated amorphous silicon. This structure makes it possible to work with control signals at the input of each stage, having a lower amplitude than that of the output signals of the register, limiting the stress on the gates of the transistors of the stage. Furthermore the structure ensures that the transistors of the unselected stages are turned off. In this way the reliability of these shift registers is improved. This shift register structure is biphase, that is to say it is driven by two complementary clocks, whose roles reverse between each stage. This makes it possible to ensure a very low duty ratio of the transistors, and therefore to ensure substantially the same lifetime for the transistors of the shift register as for the switching transistors of the active matrix.

This structure is recalled hereinafter, with reference to FIGS. 1a and 1b, derived from FIG. 3 of the aforesaid European application.

The nth row of the active matrix is denoted R(n), and the stage of the shift register 1 controlling this row R(n) is denoted $E_n$.

The stage $E_n$ is supplied by a negative source V− fed via a power supply bus and sequenced by two complementary clock signals Ck1 and Ck2. It is connected at inputs to a previous row R(n−1) and to a following row R(n+1) of the matrix. The voltage V− is typically equal to the turn-off voltage Vgoff of the transistors.

The stage $E_n$ (FIG. 1a) comprises four transistors T1, T2, T3 and T4, and two capacitors C1 and C2.

The transistors T1 and T2 are connected in series, between the previous row R(n) and the potential V−. The transistor T1 is mounted diode fashion, its gate being connected to its drain, and connected to the previous row R(n−1). The gate of the transistor T2 is connected to the following row R(n+1). The internal node $P_n$ corresponds to the series connection node of the two transistors T1 and T2, and drives the gate G of the transistor T3. The transistor T1 mounted diode fashion has a function of precharging this internal node $P_n$.

The transistors T3 and T4 are mounted in series, between a first clock signal, in the example Ck2, and the potential V−. The transistor T3 is the control transistor of the stage, or "drive" transistor, that is to say that which controls the output node $S_n$ connected to the selection row R(n). It is controlled on its gate by the potential at the internal node $P_n$ of the stage. The gate of the transistor T4 is connected to the following row R(n+1).

The capacitor C1 is driven by a clock signal, in the example Ck1, and connected to the internal node $P_n$ which drives the gate of the drive transistor T3. This capacitor C1 has only a compensation function, to compensate for the gate-drain stray capacitance of the drive transistor T3 during the switching of the signals Ck1 and Ck2.

The capacitor C2 is connected between the internal node $P_n$ and the output node $S_n$ connected to the row R(n).

The roles of the clock signals Ck1 and Ck2 are interchanged from one stage to another: in stage $E_{n+1}$ for example, it is the capacitor C1 which receives the clock signal Ck2 and the drive transistor T3 which receives the signal Ck1.

FIG. 1b schematically illustrates a shift register 1 comprising 481 stages. The first stage $E_1$ receives as input signal applied to the gate of the precharge transistor T1, the signal IN which provides the row selection pulse corresponding to a new video frame.

This signal IN propagates from row to row, in the row sequence, via the stages $E_1, E_2, \ldots E_n, \ldots E_{481}$, so that the rows R(1) to R(481) are each selected one after the other.

The manner of operation of a stage of this register will now be briefly explained, with reference to stage $E_n$ detailed in FIG. 1a and to the time chart of FIG. 3.

The clock signals Ck1 and Ck2 are complementary, i.e. in phase opposition. Typically the high level of these signals is the level Vgon (for example 26 volts), and the low level (V−), typically the level Vgoff (for example—7 volts).

The selection of the row R(n) is made when the output node $S_n$ of stage $E_n$ is raised to the high level Vgon.

Let us assume that row R(n) is selected during the row time $t_n$. Row R(n−1) was selected over the previous row time $t_{n-1}$.

During the row time $t_{n-1}$, the clock signals Ck1 and Ck2 are respectively in the high state Vgon and in the low state Vgoff and the output node $S_{n-1}$ is at Vgon.

During this row time, the transistor T1 (mounted diode fashion) of stage $E_n$ charges the internal node $P_n$ for gate control of the drive transistor T3, to the level Vgon−VtT1 of the output node $S_{n-1}$ of the previous stage (FIG. 3), where VtT1 is the threshold voltage of the transistor T1.

At time $t_n$, the state of the clock signals Ck1 and Ck2 reverses.

With the clock signal Ck2 returning to the low state Vgoff, the output node $S_{n-1}$ drop backs to Vgoff: row R(n−1) is deselected. The output node $S_{n-1}$ returns to Vgoff and the transistor T1 of stage $E_n$ turns off.

The clock signal Ck2 applied to the drive transistor T3 thus passes to the high state Vgon–VtT1: the drive transistor T3 passes to the on state. The voltage at the internal node $P_n$, which controls the gate of the drive transistor T3, rises with the source voltage (node $S_n$) of the transistor T3 through the so-called "bootstrap" effect through the capacitor C2, thereby maintaining the drive transistor T3 in the on state during the row time $t_n$.

The transistors T2 and T4 of stage $E_{n-1}$ then turn on, since their gates are taken to Vgon by the output node $S_n$ of stage $E_n$, thereby pulling the internal node $P_{n-1}$ and the output node $S_{n-1}$ of stage $E_{n-1}$ to Vgoff: row R(n–1) is deselected and the bootstrap capacitor C2 discharged.

When Ck1 rises back to Vgon and Ck2 drops back to Vgoff, the sequence is repeated for the following stage, replacing n–1 by n, n by n+1 and Ck1 by Ck2 and vice versa. Thus, with each edge of the clocks Ck1 and Ck2, there is propagation in the shift register of a row selection pulse.

The scan sequence for the rows of the matrix begins with the activation of the signal IN, which ensures the precharging of the internal node $P_1$ of the first stage.

For the last stage, a signal R-last must be provided, so as to discharge the internal node $P_{481}$ of the last stage, marking the end of the selection of the associated row R(481) (cf FIG. 1b).

For each video frame to be displayed corresponding to a frame time, each of the rows R(1) to R(481) of the matrix is thus successively selected by the associated stage, each during a row time.

A corresponding manner of operation is illustrated by the time chart of FIG. 2.

When a stage $E_n$ is not selected, the two transistors in series T1 and T2 pull some current of the previous row R(n–1) toward Vgoff. The two transistors then have lower gate-source voltages than their threshold voltage, and their channel current is an exponential function of these voltages. As a result of this arrangement, the voltage at the internal node $P_n$ is about 1 volt lower than its source voltage: the transistor T3 is in the off state. Thus, when a stage of the shift register is not selected, its transistors have their gate at a lower voltage than their threshold voltage, hence minimized transistor fatigue.

This shift register according to the prior art, or variants of this register which use the basic structure which has just been described, are much used. The transistors of the register are generally made via the same technology as those of the active matrix.

A very troublesome effect has, however, been observed on active-matrix screens furnished with such a shift register for controlling the rows, namely a reverse scan, from the top to the bottom, which gives rise to double writing of the video during the frame time, giving a mirror effect visual impression of the image to be displayed.

More precisely, it may be noted that, whereas the image is displayed from the top to the bottom, and the top of the screen is displayed normally, in parallel, the image is written from the bottom to the top: it is thus possible to observe an inverted partial display at the bottom of the screen of the image which is displayed at the top of the screen, with a join close to the middle of the screen. This leads to this mirror effect impression observed on the screen, between the top and the bottom.

It has been possible to discover that this double writing is in fact initiated by the presence, under certain conditions, of charges in the stages of the shift register, and more particularly of charges on the so-called bootstrap capacitor C2. It has been possible to demonstrate that the effect of these charges is to cause a scan of the rows in the reverse direction, activated by the discharge signal R-last for the last stage of the shift register. Once this reverse scan starts, it furthermore has the feature of being self-sustaining, so that the mirror effect is observed continually, from frame to frame.

In a more detailed manner, it has been possible to demonstrate that this mirror effect can be triggered by the activation of the signal R-last when, in the last stages of the register, bootstrap capacitors C2 are charged to a level such that the drive transistors T3 of these stages become biased to the conduction threshold, in which they have a linear behavior.

Let us consider for example the last three stages $E_{479}$, $E_{480}$, $E_{481}$, with the transistors T3 of stages $E_{479}$ and $E_{481}$ being driven by the clock signal Ck2 and the transistor T3 of stage $E_{480}$ being driven by the clock signal Ck1.

The clock signal Ck2 being in the high state Vgon, if the capacitors C2 of these stages are precharged, the transistors T3 of stages $E_{479}$ and $E_{481}$ will follow the state of the clock signal Ck2. So the precharge transistor T1 and the transistor T2 of stage $E_{480}$ are on, passing a current i between Ck2 and V–: the potential at the internal node $P_{480}$ of this stage thus becomes steady at an intermediate value between Vgon (high state of Ck2) and V–.

The same phenomenon occurs for all the even rows which are flanked by two odd rows under the same conditions.

The sum of these currents i which flow in the even stages at this instant causes the potential on the power supply bus V– to rise on account of the impedance of this bus. Under these conditions, this yields a potential V– whose value varies as a function of the rank of the stage, in practice between –7 volts (Vgoff) for the first stage and nearly +1 volt for the last stage $E_{481}$: the voltage level V– climbs toward the bottom of the screen.

The effect of this climb in the voltage V– at the bottom of the screen is to make the transistors T2 conduct less, and therefore promotes the rise in the potential of the internal node of the stages concerned.

Then we have even stages, which are kept incompletely precharged because of the divider bridge (T1,T2), during the active state at Vgon of the clock signal Ck2. The transistors T3 of these stages are thus slightly passing, sufficiently to sustain the precharge of the capacitors C2 of the odd stages; and the capacitors of these odd stages are more precharged than that of the even stages: the transistors T3 are almost saturated, and that of the last stage is in fact completely saturated.

In practice, under certain conditions, the following may thus be observed:

the propagation of a selection pulse of full amplitude on even rows of the screen: typically for example the video of row 2 will be written on row 472, the video of row 4 will be written on row 470, etc: this is the mirror effect.

a progressive filling in the bottom of the screen of the stages of the register caused by this pulse, which regenerates the starting conditions of the mirror effect observed, and sustains it.

In practice, this mirror effect can only be eliminated with the use of a specific initialization procedure triggered when the screen starts up, so as to obtain the discharging of each of the bootstrap capacitors of the stages of the register. This procedure consists in the application, during the screen initialization phase, of specific addressing conditions, which may be for example:

maintaining the signals Ck1, Ck2 at the level Vgoff for a specific time, typically of the order of a second, so as to discharge the so-called bootstrap capacitors C2; or forcing the signal R-last to the high state for a specific time, typically for about ten frames.

In the invention, another technical solution to the mirror effect problem has been found, in bootstrap capacitor discharge means integrated into each of the stages of the register.

The invention thus relates to a shift register integrated on the active-matrix substrate of a flat screen, for controlling selection rows for image points of the screen, comprising a plurality of stages in cascade, each stage being driven by first and second complementary clock signals and providing a row selection signal on an output node, and each stage comprising between an internal node and said output node ($S_n$):

a first and a second transistor connected in series between an output node of a previous stage, or a mode receiving for an input signal of the register, and a negative power supply bus, the midpoint of connection between said first and second transistors being said internal node of the stage, a third and a fourth transistor connected in series between a clock signal from among the first and the second clock signals, and a negative power supply bus, the gate of said third transistor being connected to said internal node, the midpoint of connection between said third and fourth transistors being said output node, and said second and fourth transistors being controlled on their gate by the output signal of a following stage, or of a discharge control signal in the case of the last stage of the register, and a first capacitor connected between the other clock signal and said internal node, and a second capacitor connected between said internal node and said output node, each stage comprising a discharge circuit for said second capacitor, wherein said discharge circuit is activated by an activation signal which is the discharge control signal (R-last) of the last stage, this signal (R-last) being forced to the active state when the screen starts up.

In a variant, the signal for activating the discharge circuit for the stage of rank n is provided by the output node of a stage of previous but not immediately previous rank, advantageously of rank n−2.

According to an embodiment of the invention, said discharge circuit consist of a transistor connected in parallel with said second capacitor.

According to another embodiment of the invention, said discharge circuit consist of a first transistor connected in parallel between the internal node and said negative power supply bus, and a second transistor connected in parallel between the output node and said negative power supply bus.

The invention applies to active-matrix flat screens, in particular to liquid crystal screens.

BRIEF DESCRIPTION OF THE DRAWINGS

Still other objects and advantages of the present invention will become readily apparent to those skilled in the art from the following detailed description, wherein the preferred embodiments of the invention are shown and described, simply by way of illustration of the best mode contemplated of carrying out the invention. As will be realized, the invention is capable of other and different embodiments, and its several details are capable of modifications in various obvious aspects, all without departing from the invention.

Accordingly, the drawings and description thereof are to be regarded as illustrative in nature, and not as restrictive.

DETAILED DESCRIPTION

In the invention, a shift register stage comprises integrated discharge means for the bootstrap capacitor, which are activated at least once when the screen starts up, that is to say when it is powered up, and advantageously, with each new video frame.

Figure 1A:
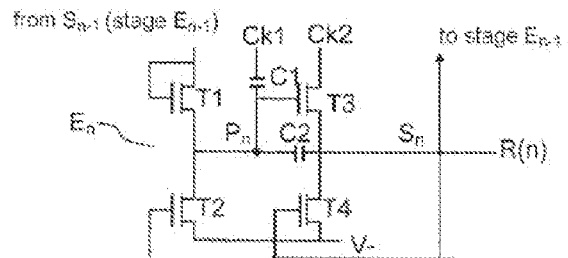
FIGS. 1a and 1b illustrate a shift register according to the prior art.
Figure 1A:
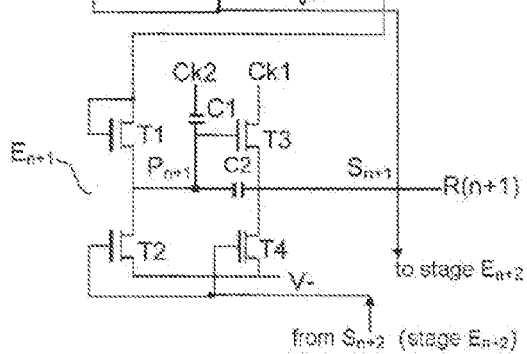
Figure 1B:
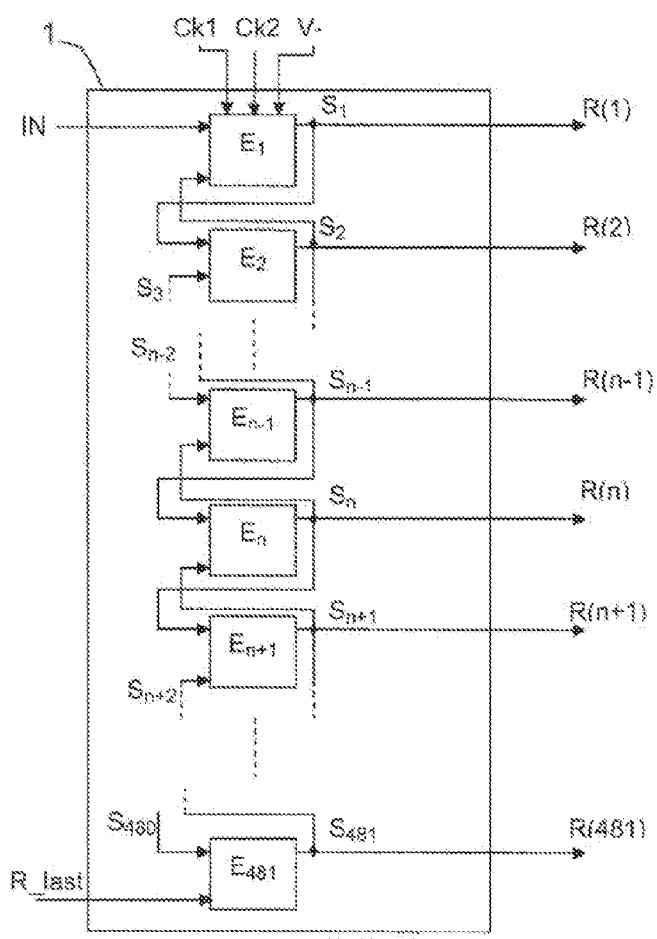
Figure 2:
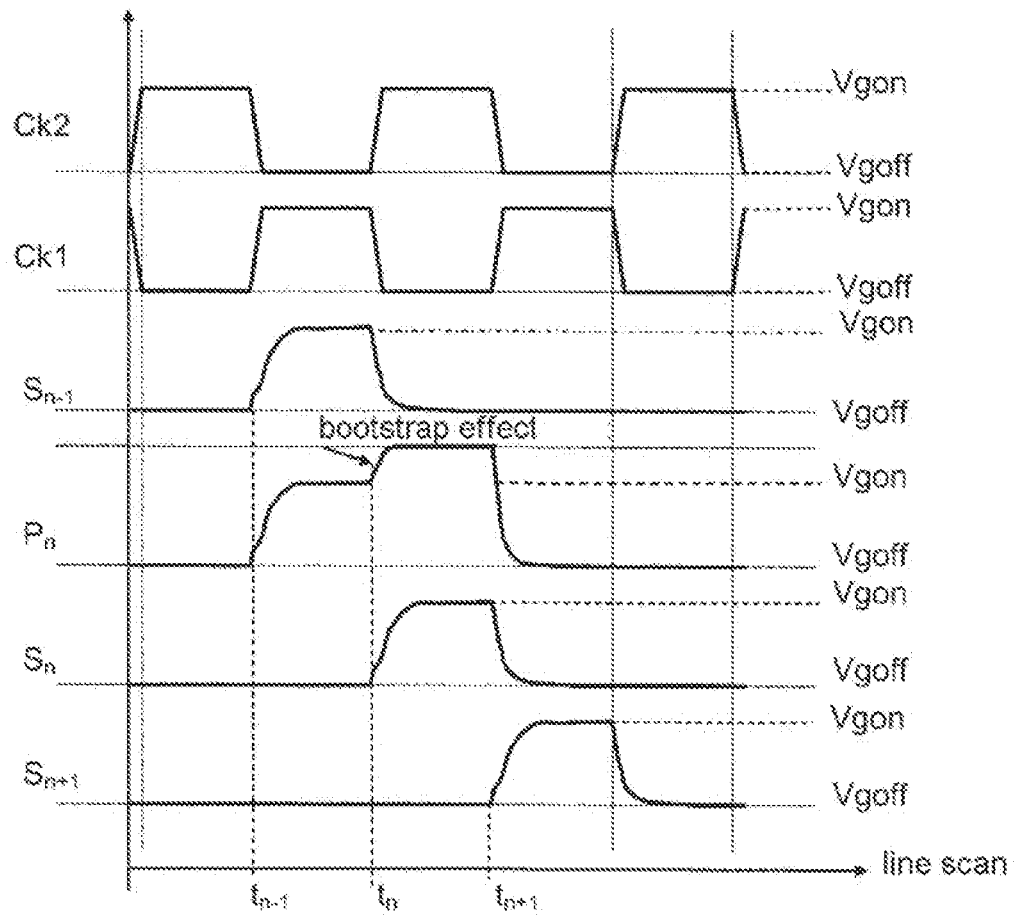
FIG. 2 is a time chart of the signals illustrating the manner of operation of such a register.

The invention is illustrated with reference to FIGS. 3 to 8 which illustrate different variants of the invention, applied by way of example to a shift register comprising 481 stages $E_1$ to $E_{481}$ for controlling 481 selection rows R(1) to R(481). This register has a structure in accordance with the prior art structure described in relation to FIGS. 1a, 1b and 2. It is controlled by four signals: two complementary clock signals Ck1 and Ck2, an input signal IN emitted by a matrix addressing circuit at each new video frame, and a signal R-last for controlling the end of row selection of the last stage $E_{481}$.

Figure 3:
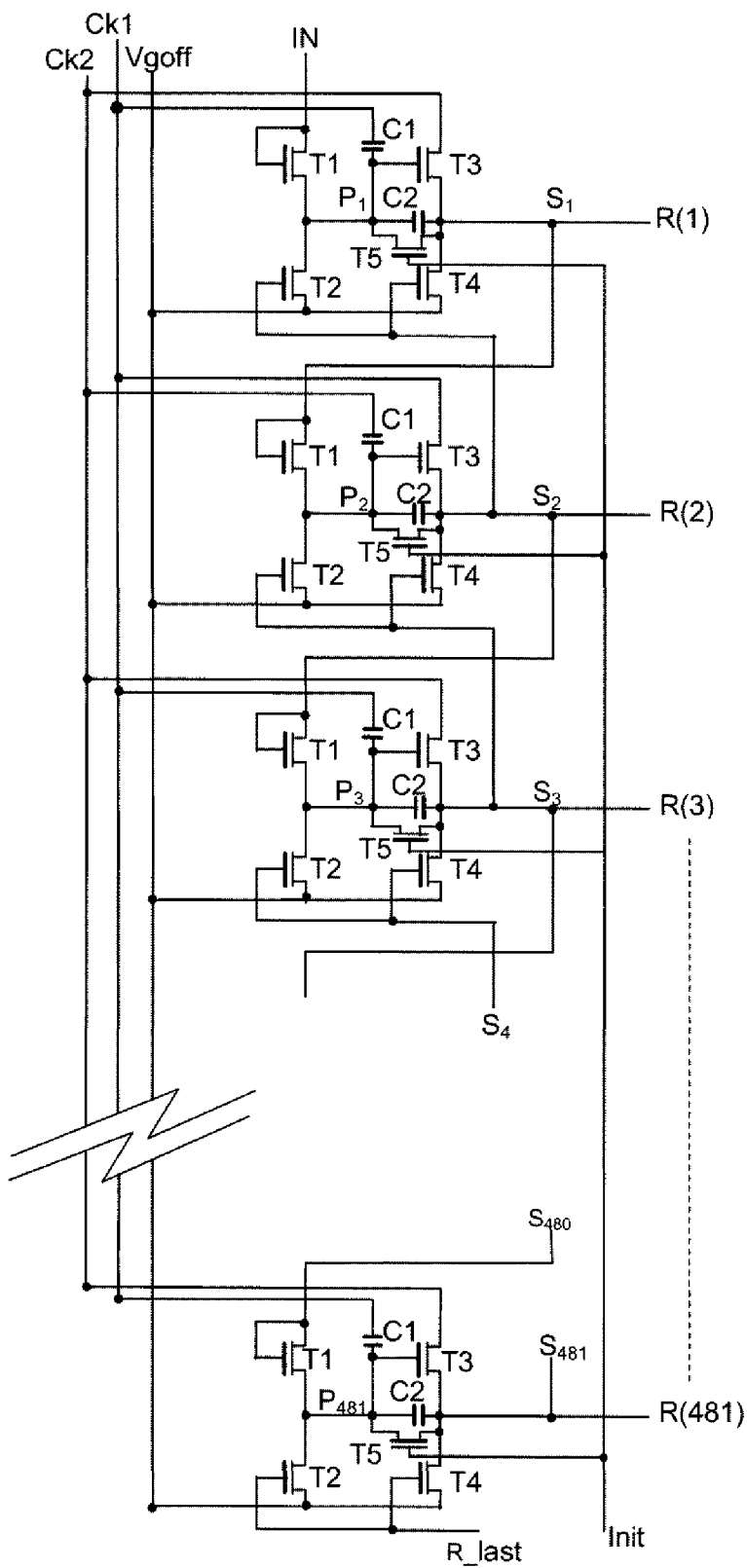
FIG. 3 is a diagram of a shift register according to a first embodiment of the invention.
Figure 4:
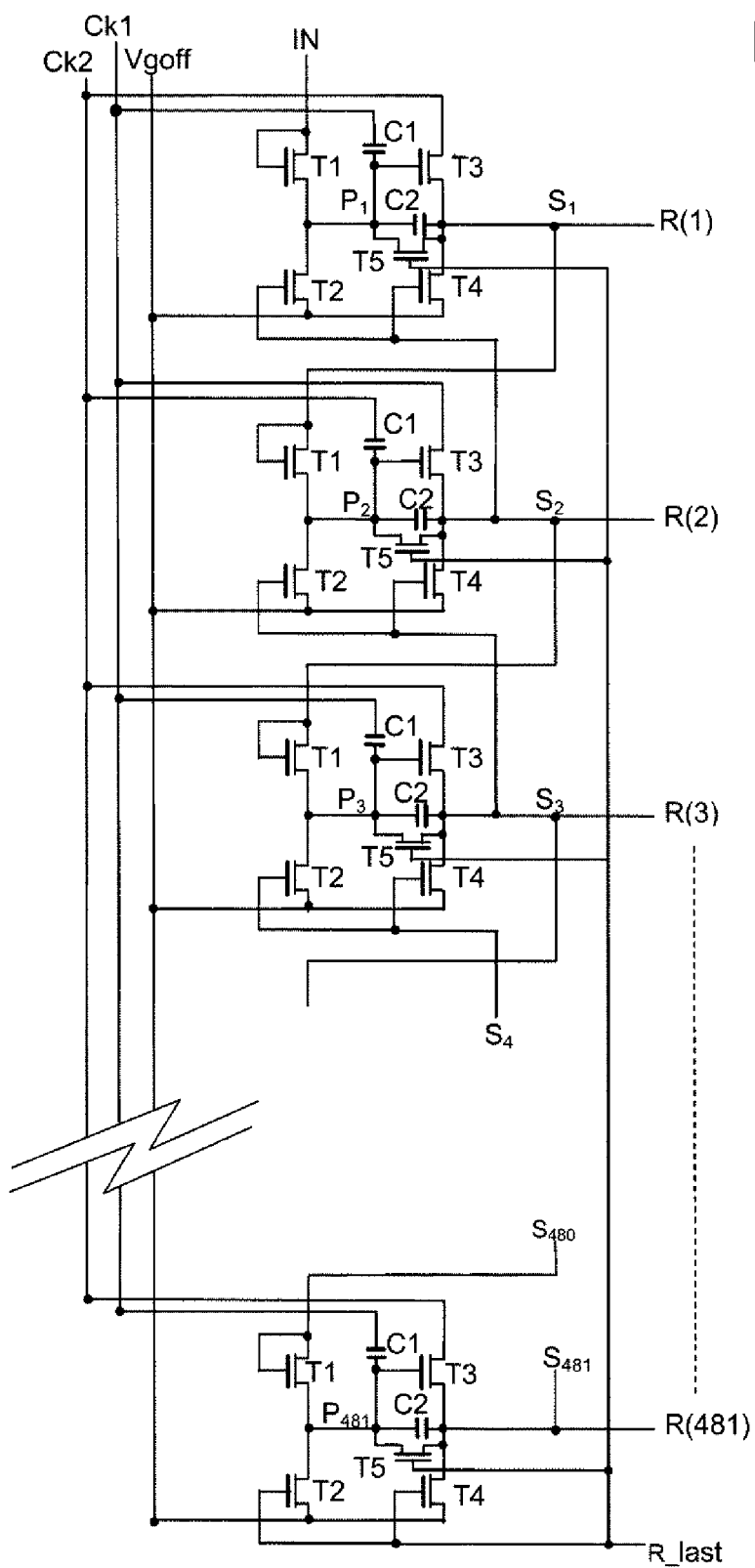
FIG. 4 illustrates a first control variant of this register.
Figure 5:
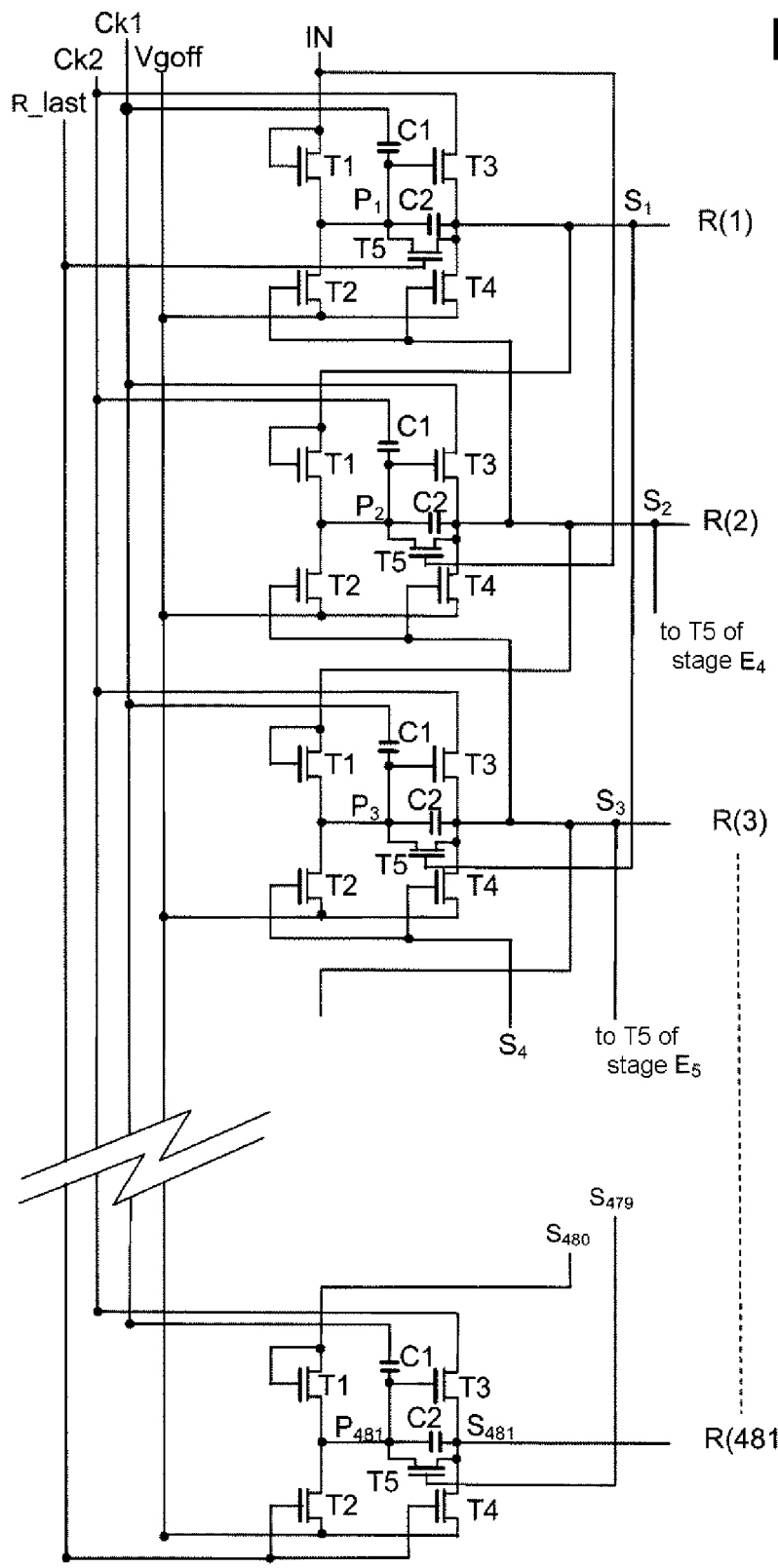
FIG. 5 illustrates a second control variant of this register.

In a first embodiment illustrated in FIGS. 3 to 5, these integrated means comprise a discharge transistor T5, connected in parallel with the bootstrap capacitor C2.

Figure 6:
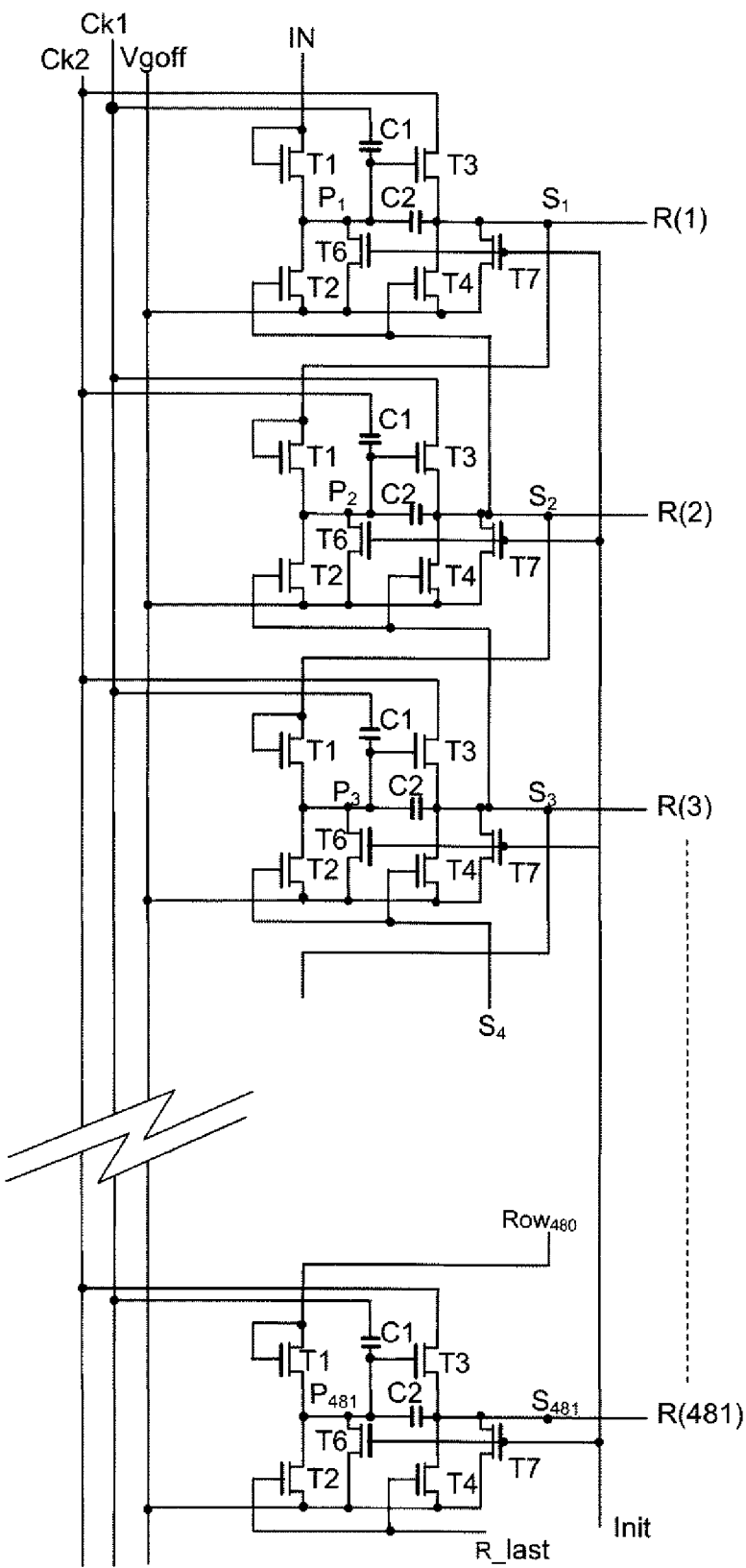
FIG. 6 is a diagram of a shift register according to a second embodiment of the invention.
Figure 7:
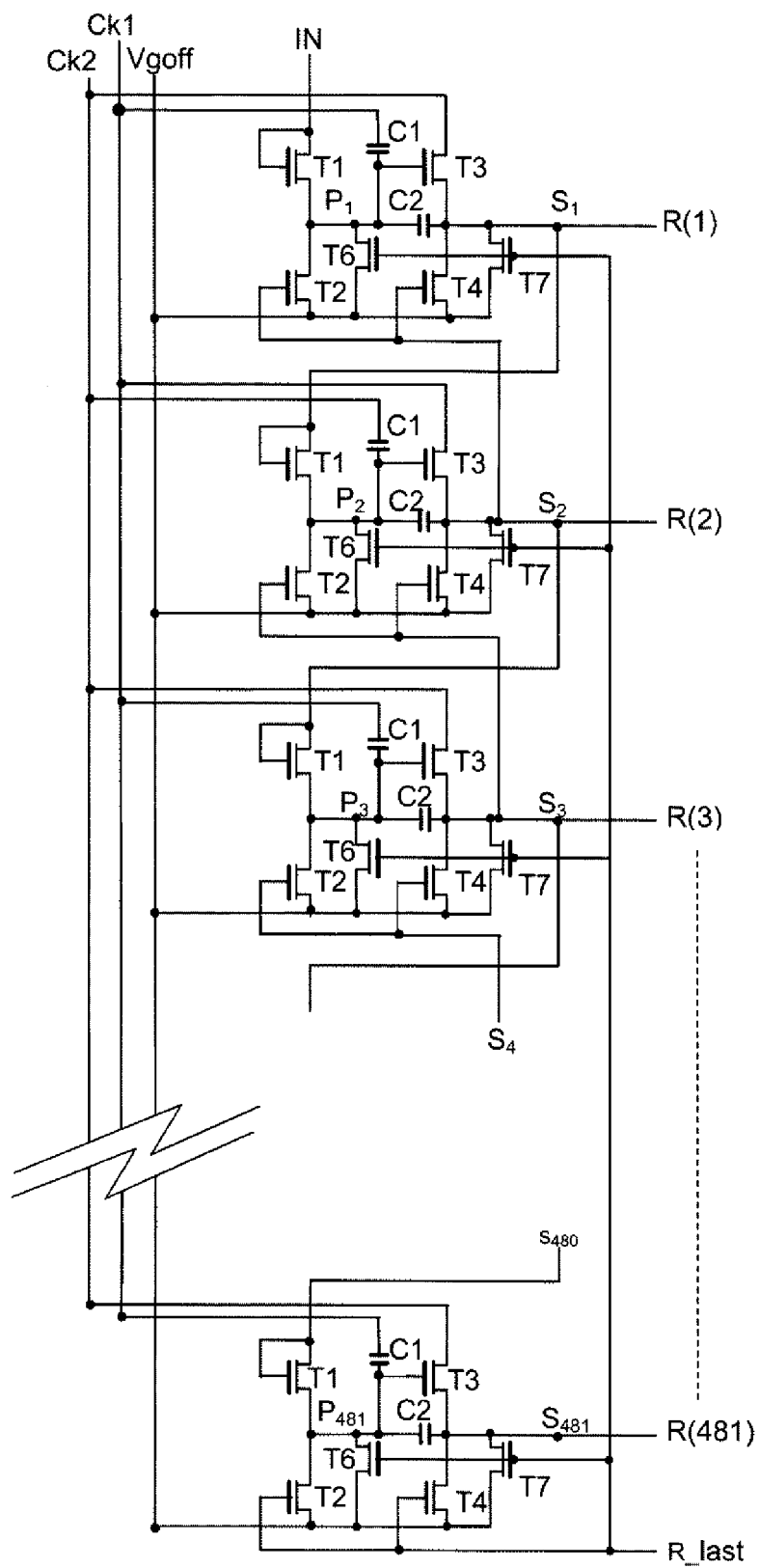
FIG. 7 illustrates a first control variant of this register.
Figure 8:
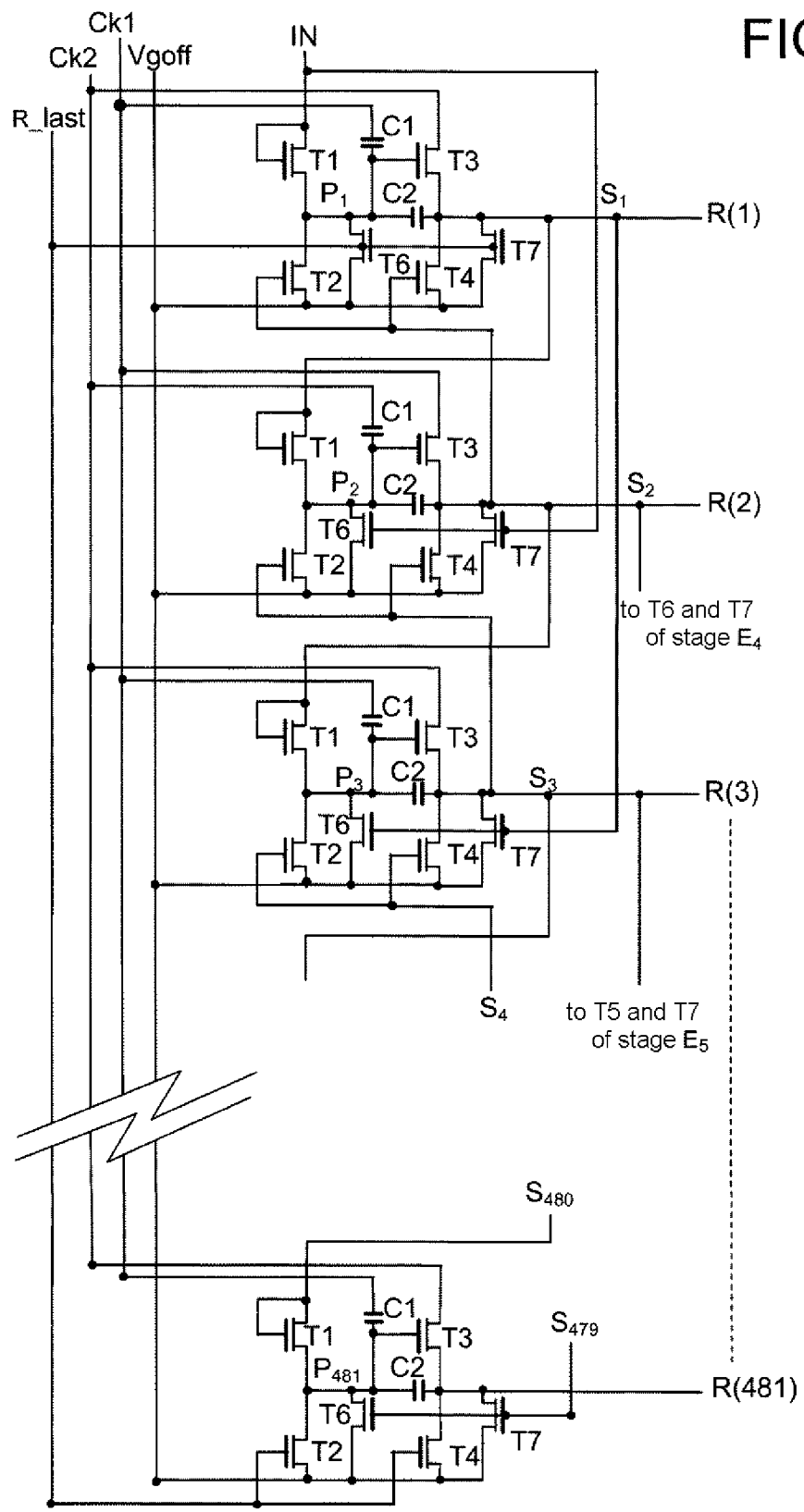
FIG. 8 illustrates a second control variant of this register.

In a second embodiment, illustrated in FIGS. 6 to 8, these integrated means comprise two discharge transistors T6 and T7 each connected to a respective terminal of the bootstrap capacitor C2, and between this terminal and the negative voltage V− (or Vgoff).

These integrated discharge means for the bootstrap capacitor must be activated at least once when the screen starts up.

An embodiment of this control is illustrated in FIGS. 3 and 6.

In this mode, a specific initialization signal Init is generated by a screen initialization circuit. This signal Init is applied to the control gate of the discharge transistor T5 (FIG. 3) or of the discharge transistors T6 and T7 (FIG. 6), in all the stages of the shift register.

This embodiment requires the provision of an additional conducting line, so as to apply a signal generated specifically for this discharge means activation function for the bootstrap capacitor C2.

In a first refinement illustrated in FIGS. 4 and 7, the signal R-last already present is advantageously used. Provision is then made to "lengthen" the conducting line conveying this signal to the last stage, so as to apply this signal to all the stages.

In this embodiment, the signal R-last being a pulse marking the end of selection of the last row R(481) of the screen, which is therefore activated with each new video frame at the end of the video frame time, the discharging of the bootstrap capacitor C2 is thus carried out by the discharge means of the invention at the end of each video frame.

Preferably, there is provision furthermore for the signal R-last to be activated a first time when the screen starts up, so as to activate the discharge means during this startup.

The use of a conducting line, either additional, for the signal Init, or "lengthened", for the signal R-last, and which runs along the whole register so as to apply the discharge means activation signal to all the stages, gives rise to a more complicated design of the matrix, with crossovers of rows at all the stages, making it necessary to review the design of the layout in the peripheral zone of the active matrix. Furthermore, this variant poses a problem of capacitive charge of the control row, since it links the gates of all the discharge transistors of the register.

An optimized mode of control is illustrated in FIGS. 5 and 8, which uses as discharge means activation signal for the bootstrap capacitor C2 of a stage, the row selection signal of a previous but not immediately previous stage. Preferably, for a stage $E_n$, the row selection signal provided by the stage $E_{n-2}$, to the output node $S_{n-2}$ will advantageously be used: the activation signal must originate at least from the stage of rank n−2, so as not to wipe away the precharge of the internal node $P_n$ of stage $E_n$ of the driver; And to limit the problem of the crossovers of rows, the signal provided by the closest stage after stage $E_{n-1}$ is advantageously chosen, i.e. that provided by stage $E_{n-2}$.

This mode of control is advantageous since it can be easily implemented, at lesser cost, without necessitating any complete retrofit of already marketed active matrices and as it makes it possible to obtain the discharging of the bootstrap capacitor at each stage, at each new video frame.

As a function of the rank of the activation signal adopted, the first stages of the register must be controlled another way. Notably, in all cases provision must be made for a different activation for the first two stages $E_1$ and $E_2$ (there is no stage of "rank −1, −2, −3 . . . )". A simple and advantageous solution makes provision to use the available signals, notably to apply as discharge means activation signal, the signal R-last for these stages. In the example illustrated, the signal R-last is used for the first stage $E_1$, and the input signal IN of the first stage $E_1$ for the second stage $E_2$.

Figure 9:
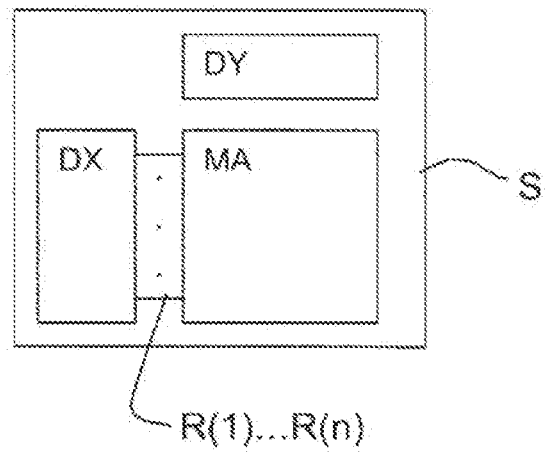
FIG. 9 schematically illustrates an integrated driver active-matrix substrate.

The invention applies to so-called "integrated driver" flat screens, notably liquid crystal or OLED flat screens, of the active-matrix type: as illustrated in FIG. 9, on one and the same substrate S of the screen are made the active matrix MA, that is to say the pixel electrodes and their associated switching devices, the control circuit for the rows DY and the control circuit for the rows DX, to which the invention applies.

It will be readily seen by one of ordinary skill in the art that the present invention fulfils all of the objects set forth above. After reading the foregoing specification, one of ordinary skill in the art will be able to affect various changes, substitutions of equivalents and various aspects of the invention as broadly disclosed herein. It is therefore intended that the protection granted hereon be limited only by the definition contained in the appended claims and equivalent thereof.

The invention claimed is:

1. A shift register integrated on an active-matrix substrate of a flat screen, for controlling selection rows for image points of the flat screen, the shift register comprising a plurality of stages in cascade, each stage being driven by first and second complementary clock signals and providing a row selection signal on an output node, and each stage, between an internal node and said output node, comprising:
a first and a second transistor connected in series between an output node of a previous stage, or a node receiving an input signal of the register, and a negative power supply bus, the midpoint of connection between said first and second transistors being said internal node of the stage,
a third and a fourth transistor connected in series between a clock signal from among the first and second complementary clock signals, and a negative power supply bus, the gate of said third transistor being connected to said internal node, the midpoint of connection between said third and fourth transistors being said output node, said second and fourth transistors being controlled on their gate by an output signal of a following stage, or by a discharge control signal for the last stage of the shift register, and
a first capacitor connected between the other of the first and second complementary clock signals and said internal node, and a second capacitor connected between said internal node and said output node,
each stage comprising a discharge circuit to discharge said second capacitor, wherein said discharge circuit is activated by an activation signal which is the discharge control signal of the last stage, the discharge control signal being in an active state when the flat screen starts up.

2. A shift register integrated on an active-matrix substrate of a flat screen, for controlling selection rows for image points of the flat screen, the shift register comprising a plurality of stages in cascade, each stage being driven by first and second complementary clock signals and providing a row selection signal on an output node, and each stag, between an internal node and said output node, comprising:
a first and a second transistor connected in series between an output node of a previous stage, or a node receiving an input signal of the register, and a negative power supply bus, the midpoint of connection between said first and second transistors being said internal node of the stage,
a third and a fourth transistor connected in series between a clock signal from among the first and second complementary clock signals, and a negative power supply bus, the gate of said third transistor being connected to said internal node, the midpoint of connection between said third and fourth transistors being said output node, said second and fourth transistors being controlled on their gate by an output signal of a following stage, or by a discharge control signal for the last stage of the shift register, and
a first capacitor connected between the other of the first and second complementary clock signals and said internal node, and a second capacitor connected between said internal node and said output node,
each stage comprising a discharge circuit to discharge said second capacitor, wherein the discharge circuit of a stage of rank n is activated by a signal provided by the output node of a stage of a previous but not immediately previous rank.

3. The shift register as claimed in claim 2, wherein said previous but not immediately previous rank is the rank n−2.

4. The shift register as claimed in claim 2, wherein the discharge circuit of a first stage of the shift register is activated by said discharge control signal of the last stage, and the discharge circuit of a second stage of the shift register is activated by the discharge control signal or said input signal of the register, said discharge control signal being in an active state when the flat screen starts up.

5. The register as claimed in claim 1, wherein said discharge circuit consists of a transistor connected in parallel with said second capacitor.

6. The register as claimed claim 1, wherein said discharge circuit consists of a first transistor connected in parallel between the internal node and said negative power supply bus, and a second transistor connected in parallel between the output node and said negative power supply bus.

7. An active-matrix flat screen, comprising a shift register as claimed in claim 1.

8. The register as claimed in claim 2, wherein said discharge circuit consists of a transistor connected in parallel with said second capacitor.

9. The register as claimed claim 2, wherein said discharge circuit consists of a first transistor connected in parallel between the internal node and said negative power supply bus, and a second transistor connected in parallel between the output node and said negative power supply bus.

10. An active-matrix flat screen, comprising a shift register as claimed in claim 2.

* * * * *